United States Patent [19]
Williams

[11] Patent Number: 5,726,594
[45] Date of Patent: Mar. 10, 1998

[54] SWITCHING DEVICE INCLUDING POWER MOSFET WITH INTERNAL POWER SUPPLY CIRCUIT

[75] Inventor: Richard K. Williams, Cupertino, Calif.

[73] Assignee: Siliconix Incorporated, Santa Clara, Calif.

[21] Appl. No.: 538,105

[22] Filed: Oct. 2, 1995

[51] Int. Cl.[6] ...................................... H03K 1/00
[52] U.S. Cl. .................. 327/108; 327/434; 327/581; 327/374
[58] Field of Search .................... 327/427, 434, 327/390, 399, 537, 108–112, 391, 170, 581, 374–377; 326/88

[56] References Cited

U.S. PATENT DOCUMENTS

| | | | |
|---|---|---|---|
| 4,649,302 | 3/1987 | Damiano et al. | 327/434 |
| 4,737,667 | 4/1988 | Tihanyi | 326/88 |
| 4,811,156 | 3/1989 | Kroll | 361/58 |
| 4,992,683 | 2/1991 | Robin, Jr. | 327/432 |
| 5,126,651 | 6/1992 | Gauen | 323/222 |

*Primary Examiner*—Timothy P. Callahan
*Assistant Examiner*—Kenneth B. Wells
*Attorney, Agent, or Firm*—Skjerven, Morrill, MacPherson, Franklin & Friel; David E. Steuber

[57] ABSTRACT

An N-channel power MOSFET includes a storage capacitor and a pair of diodes connected between the gate and drain terminals, respectively, and the capacitor. Since at any given time the voltage at either the drain or the gate of the MOSFET is high, a charge is maintained on the storage capacitor as the MOSFET is switched on and off. The charge stored on the capacitor yields an output voltage which may be used to power a gate drive circuit or other components within or outside the MOSFET.

30 Claims, 5 Drawing Sheets

5,726,594

1

SWITCHING DEVICE INCLUDING POWER MOSFET WITH INTERNAL POWER SUPPLY CIRCUIT

FIELD OF THE INVENTION

This invention relates to power MOSFETs and in particular to circuitry for providing power for the gate drive or other components within or outside the MOSFET.

BACKGROUND OF THE INVENTION

Driving conventional power MOSFETs from active control circuitry requires a separate pin or input terminal, in addition to the source, drain and gate terminals, for connection to a power supply. For example, MOSFET M1 shown in FIG. 1 contains an input A through which a supply voltage $V_{CC}$ is provided to a control circuit C1, which in turn supplies a gate drive signal $V_{GS}$ to the gate of MOSFET M1.

In FIG. 2, control circuit C1 is shown as including CMOS buffers A1, A2 and A3, which increase the current supplied to the gate of MOSFET M1. Buffer A1 provides a low input capacitance but little current gain. Buffer A2 doubles the current from the first stage, and buffer A3 doubles the current again. As is well known, the width-to-length ratio W/L of the channel of the NMOSFET in buffer A1 sets its current sinking and sourcing ability. A minimum size gate in a 2 µm technology may be a W/L=20 µm/2 µm for the NMOSFET, and the W/L for the PMOSFET in buffer A1 would be 40 µm/2 µm; in buffer A2, W/L for the NMOSFET would be 40 µm/2 µm and W/L for the PMOSFET would be 80 µm/2 µm; in buffer A3, W/L for the NMOSFET would be 80 µm/2 µm and W/L for the PMOSFET would be 160 µm/2 µm. Each of buffers A1, A2 and A3 is supplied by a voltage equal to the difference between $V_{CC}$ and $V_S$ (which in this case is ground). The current needed to drive each stage is derived from power drawn from the $V_{CC}$ pin. The output of digital logic or a microprocessor may be incapable of driving the input capacitance of the power MOSFET directly. The result would be a slow switching speed and possible overheating of the power MOSFET. The buffers solve this problem by drawing power from $V_{CC}$ stage-by-stage to speed up the switching of the MOSFET.

Thus, in the circuit of FIG. 2 it is still necessary to provide control circuit C1 with a separate input $V_{CC}$. In many situations, it is difficult or at least inconvenient to provide a separate power input. One possible reason is that the buffers may operate on a different supply voltage. A separate supply line may not be available on the printed circuit board (PCB) in the vicinity of the power device. Most importantly, a separate $V_{CC}$ pin precludes integration of the buffer into the same silicon or same package as the power MOSFET, since the least costly high power packages such as the TO-220 or D²PAK (a mechanical drawing registered with JEDEC) have only three terminals. Therefore, the power for the buffer must be derived from at least one pair of the pins.

SUMMARY OF THE INVENTION

In accordance with this invention, a switching device includes a power MOSFET which is fabricated with internal power supply circuitry. The internal power circuitry includes a first diode connected between the drain and a storage capacitor and a second diode connected between the gate and the storage capacitor. The first and second diodes are connected to the same terminal of the storage capacitor; the other terminal of the storage capacitor is preferably connected to the source of the MOSFET.

2

As the MOSFET is switched on and off, either the drain or the gate is always high, i.e., the gate is high when the MOSFET is turned on or the drain is high when the MOSFET is turned off (and the gate is low). Whichever of the gate and drain terminals is high supplies a potential to the storage capacitor. The diode connected to the low terminal is reverse-biased, thereby preventing the storage capacitor from discharging through that terminal.

In a preferred embodiment, an optional $V_{CC}$ input terminal is connected to the storage capacitor through a third diode. The $V_{CC}$ input can be connected to a voltage supply when it is convenient to do so and otherwise left unconnected.

Resistors of an appropriate size are connected in series with each of the diodes to regulate the flow of current into the capacitor. In particular, it is desirable not to overload the input signal for the gate drive. In an embodiment which includes a $V_{CC}$ input a P-channel MOSFET can be connected in series with the diode which supplies current from the gate terminal. The gate of the PMOSFET is connected to the $V_{CC}$ input. When the $V_{CC}$ input is connected to a voltage source, the PMOSFET is turned off and prevents the internal power supply circuitry from loading the gate input to the MOSFET.

The charge stored on the storage capacitor can be used to supply power to a gate drive circuit in the MOSFET or other components, such as simple logic, oscillators, charge pumps, overcurrent protection devices, overvoltage protection devices and overtemperature protection devices, inside or outside the MOSFET.

DESCRIPTION OF THE INVENTION

Figure 3:
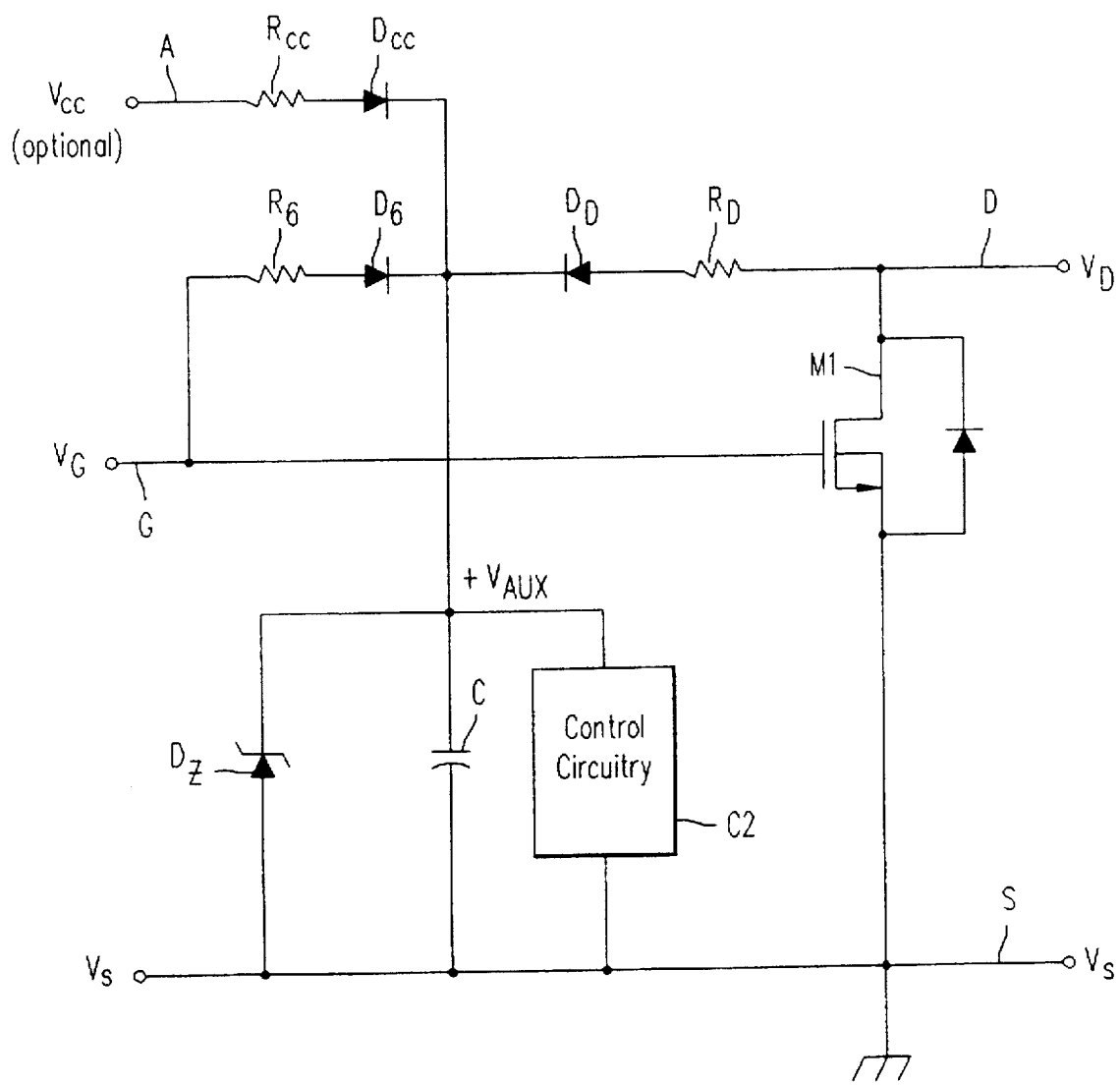
FIG. 3 illustrates a MOSFET which includes internal power supply circuitry in accordance with this invention.

A first embodiment of the invention is shown in FIG. 3. MOSFET M1 is shown with a diode $D_G$ and a resistor $R_G$ connected in series between the gate input terminal G and a terminal of a capacitor C. A diode $D_D$ and a resistor $R_D$ are connected in series between the drain terminal D and the same terminal of capacitor C. The other terminal of capacitor C is connected to the source terminal S of MOSFET M1, which is grounded. As MOSFET M1 is switched on and off, at any given time the voltage at either the gate terminal G or the drain terminal D is high, and whichever terminal is high supplies charge to capacitor C through the corresponding one of diodes $D_G$ and $D_D$. As a result a supply voltage $+V_{AUX}$ is formed on capacitor C. A zener diode $D_Z$ is used to clamp the voltage on capacitor C to some safe limit, e.g., above 2.5 V, 5 V or 15 V (commonly used values of $V_G$). The maximum safe value is generally chosen to be a voltage that is equal to the thickness of the gate oxide layer of the MOSFET times 4 MV/cm, or around 16 V for a 400 Å thick gate oxide layer.

The supply voltage $+V_{AUX}$ is used to supply a control circuit C2. Control circuit C2 may be used in the main signal path of the gate pin of the MOSFET. Alternatively, control circuit C2 may not be directly involved in the gate drive circuitry but instead may send a signal to external devices through another pin of the MOSFET.

Figure 1:
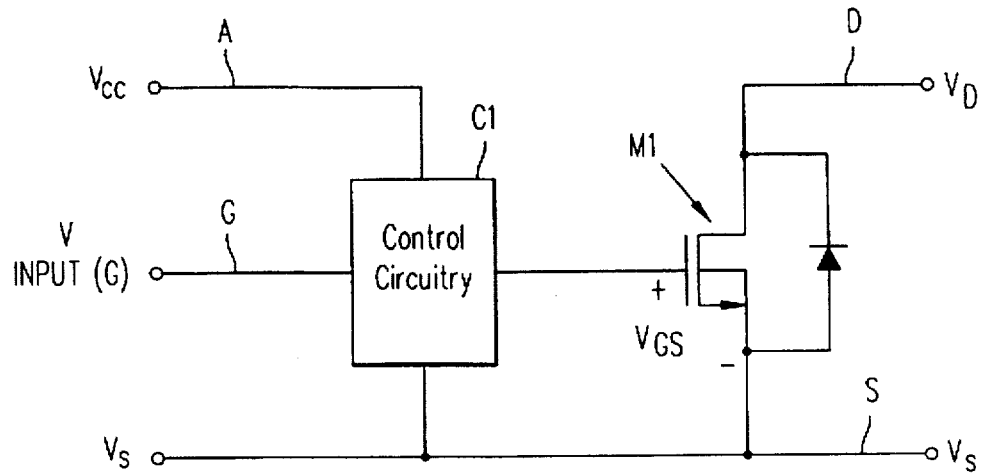
FIG. 1 illustrates a conventional MOSFET including gate drive control circuitry.
Figure 2:
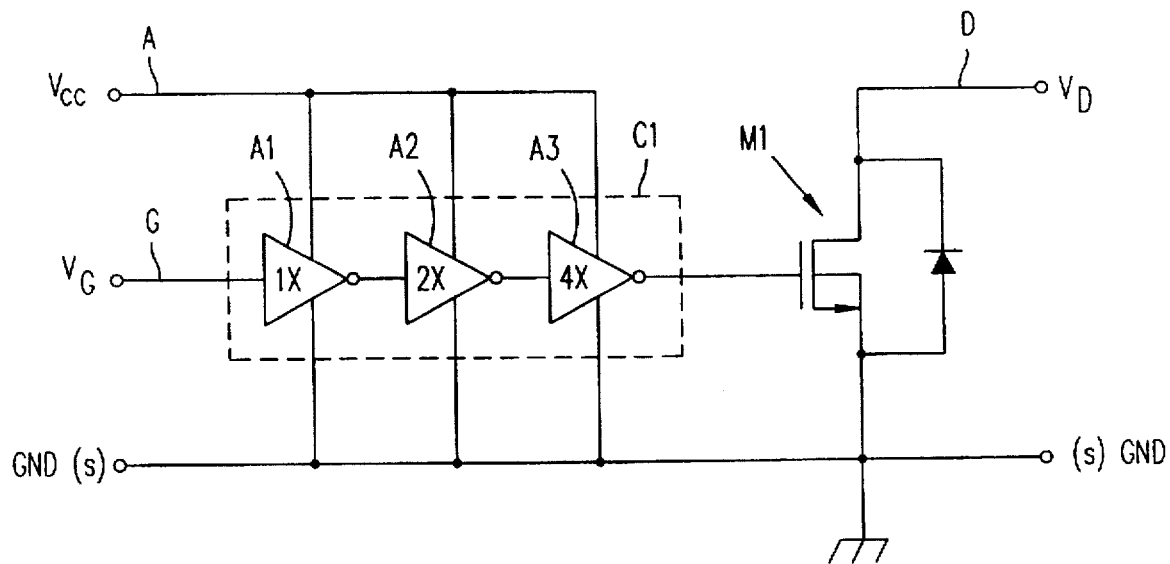
FIG. 2 illustrates the MOSFET of FIG. 1 wherein the gate drive circuitry includes a string of buffers which boost the current supplied to the gate of the MOSFET.
Figure 4:
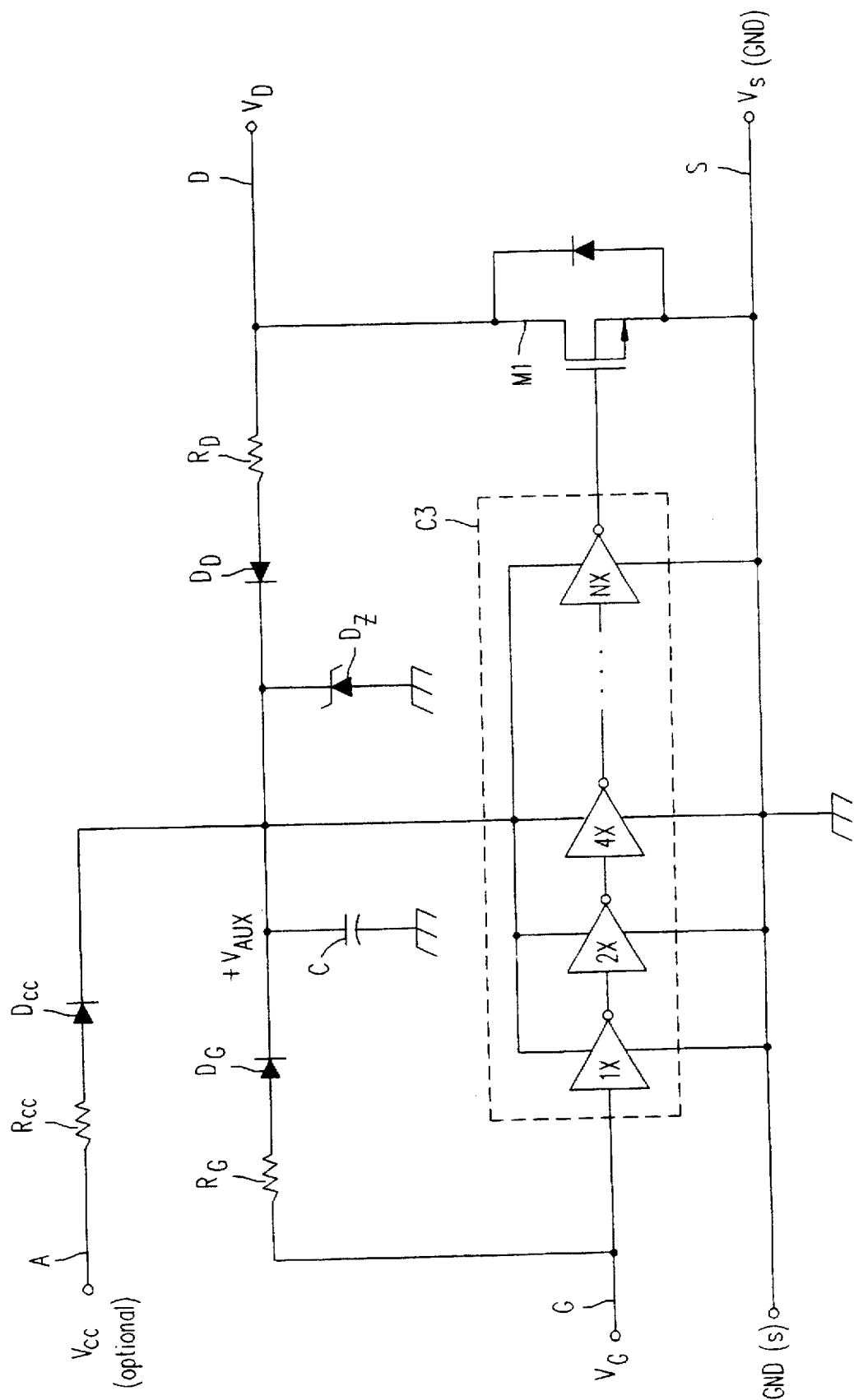
FIG. 4 illustrates a MOSFET of this invention with gate control circuitry which includes a string of buffers.

FIG. 4 shows an arrangement in which $+V_{AUX}$ is used to drive a control circuit C3, which includes N buffers of the kind that are included in gate control circuit C1 shown in FIG. 2.

Referring again to FIG. 3, the resistors $R_G$ and $R_D$ are set at values which allow appropriate currents to flow from the gate and drain terminals, respectively, of MOSFET M1 into capacitor C. Generally speaking, resistor $R_D$ will have a lower value than resistor $R_G$, since the drain is normally connected to a more robust source of power (higher current) than the gate. The value of gate resistor $R_G$ may typically range from 1 kΩ to 1 MΩ, with 200 kΩ being preferred to limit the gate current to about 25 μA for a 5 V gate drive. The value of drain resistor $R_D$ can range from a few ohms to 100 kΩ.

Generally speaking, the value of the capacitor C is chosen to be as large as possible to provide most (i.e., more than one-half) of the current to charge the MOSFET's gate during a turn-on transient. Values of capacitor C can range from hundreds of pF to tens of μF. Because small physical size is important, a value of several nF to around 10 nF is desirable, specifically if the value of capacitor C is at least twice that of the input capacitance of the power MOSFET.

Also shown in FIGS. 3 and 4 is an optional input A for carrying $V_{CC}$. Input A is connected to capacitor C through a diode $D_{CC}$ and a resistor $R_{CC}$. Input A can be connected to an external voltage supply when it is available; otherwise, input A is left unconnected. When input A is connected, the external voltage supply in effect supersedes the drain and gate as suppliers of capacitor C, and diodes $D_D$ and $D_G$ may remain reverse-biased, especially if the series resistor $R_{CC}$ is smaller than either of the resistors $R_G$ or $R_D$.

Figure 5:
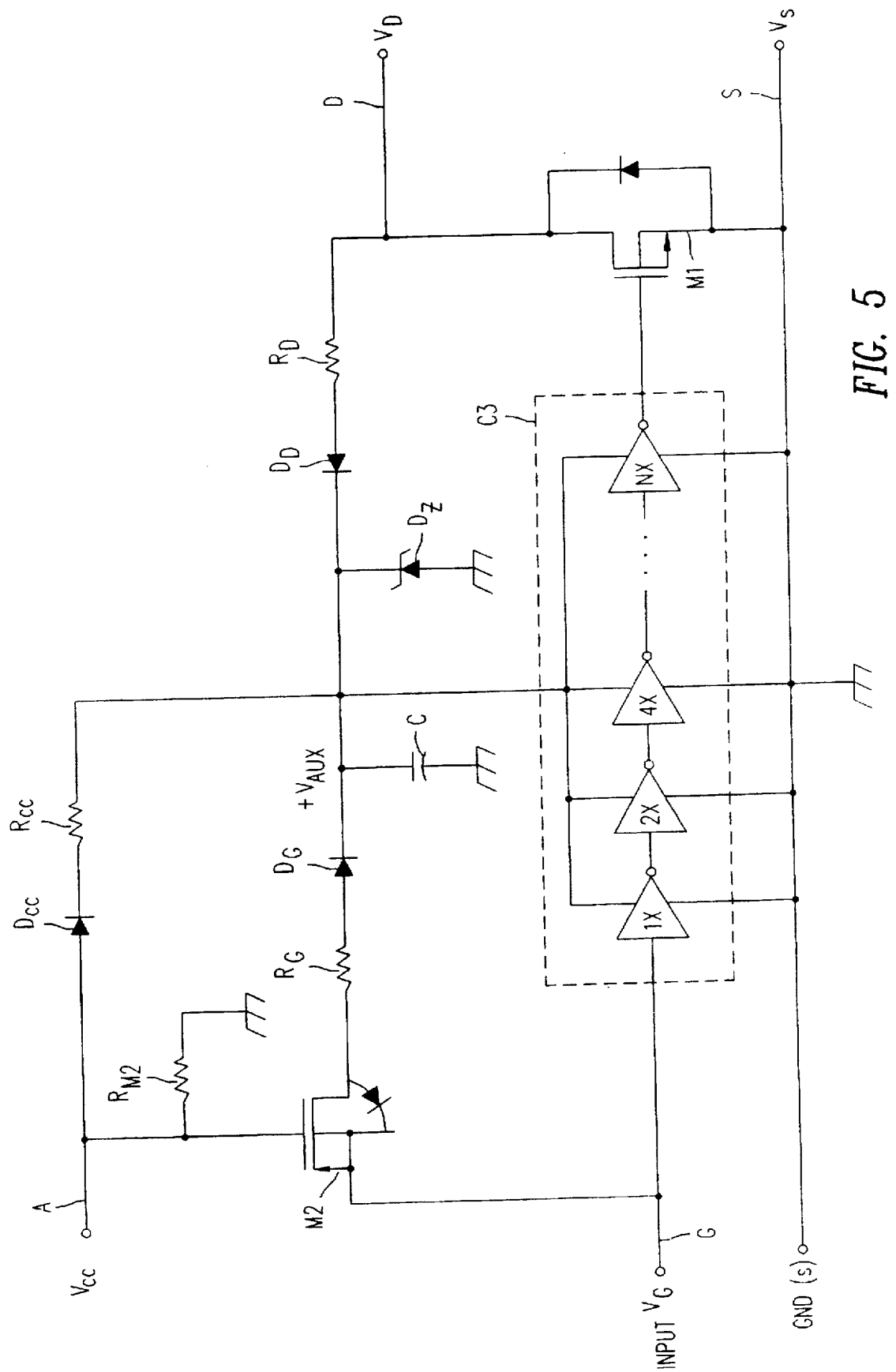
FIG. 5 illustrates an alternative embodiment which includes a PMOSFET which is used to isolate the power supply circuitry from the gate input when the $V_{CC}$ input is connected to an external power supply.

FIG. 5 illustrates an alternative embodiment in which a P-channel MOSFET M2 is connected in the series path from the gate input G to capacitor C. The gate of PMOSFET M2 is tied to input A and through a resistor $R_{M2}$ to ground. When input A is connected to a source of $V_{CC}$, the gate of PMOSFET M2 is driven high, turning off PMOSFET M2 and isolating the gate input G from capacitor C. This prevents any loading on the gate input G when an external source of $V_{CC}$ is used. Otherwise, when input A is left unconnected, the gate of PMOSFET M2 is grounded and PMOSFET M2 remains turned on.

Figure 6:
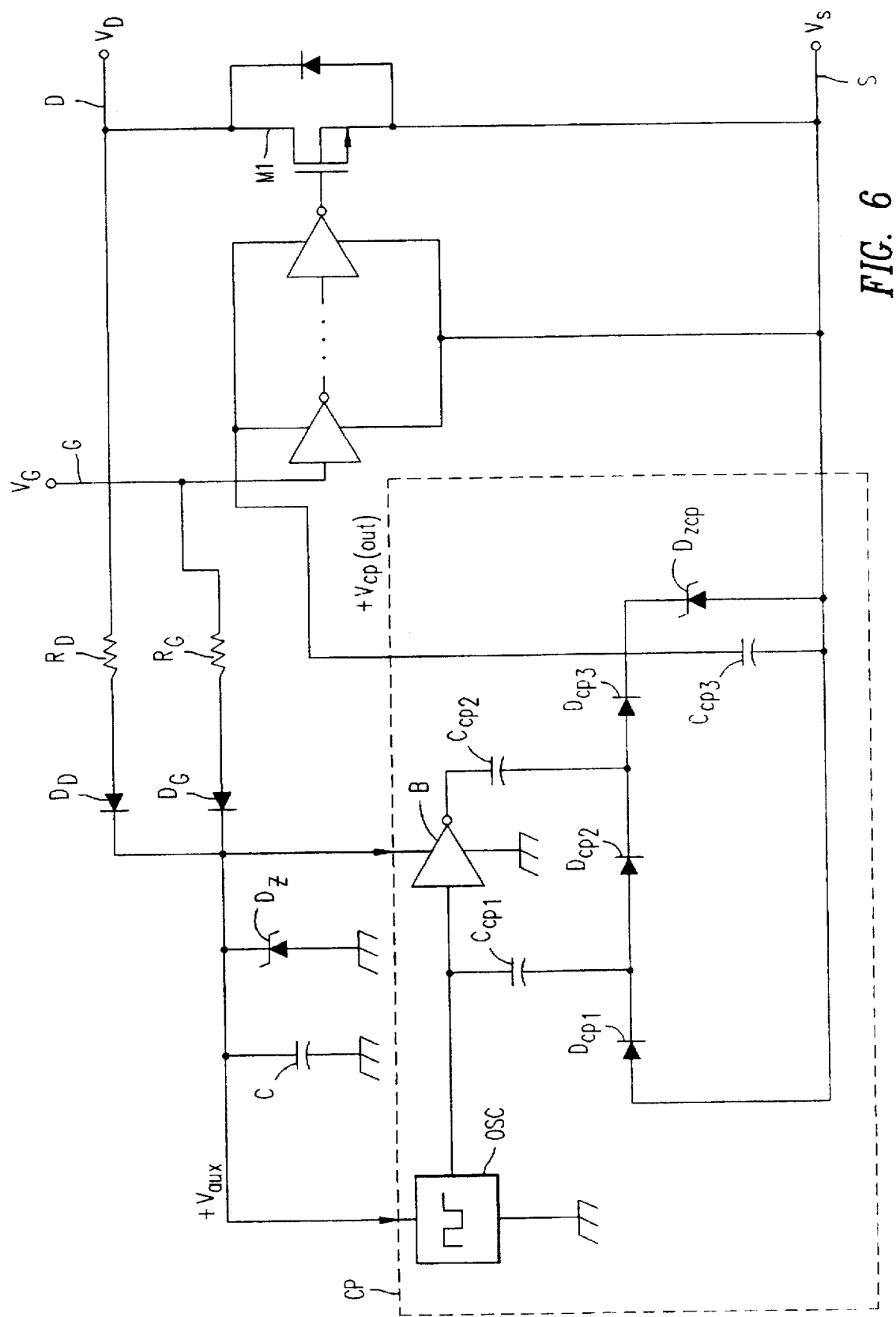
FIG. 6 illustrates a MOSFET of this invention which includes a charge pump.

While specific embodiments according to this invention have been described, numerous alternative embodiments will be apparent to those skilled in the art. For example, although in the embodiment specifically described above, the $+V_{AUX}$ supply voltage was used to power a gate control circuit, $+V_{AUX}$ could also be used to supply numerous other components, such as charge pumps, logic circuitry, and protection circuitry for overtemperature or overcurrent conditions. For example, FIG. 6 shows $+V_{AUX}$ coupled to a charge pump CP which includes an oscillator OSC, an inverter B, diodes Dope, $D_{cp1}$, $D_{cp2}$ and $D_{cp3}$, and capacitors $C_{cp1}$ and $C_{cp2}$. Charge pump CP operates in a well-known manner to create a charge on the reservoir capacitor $C_{cp3}$, which is clamped by a zener diode $D_{zcp}$. The output $+V_{cp}$ (out) is used to power a gate buffer chain similar to that shown in FIG. 2.

The broad principles of this invention are intended to cover all such alternative embodiments.

I claim:

1. A switching device comprising:

a power MOSFET, said MOSFET having a source, a drain and a gate, said drain being coupled to a first main terminal of said switching device, said source being coupled to a second main terminal of said switching device; and power supply circuitry for driving said gate, said power supply circuitry comprising a storage capacitor, an output of said power supply circuitry being coupled to said gate, a control terminal of said switching device being coupled through a first diode to said storage capacitor, said drain being coupled through a second diode to said storage capacitor, said first diode being oriented so as to allow current to flow from said control terminal through said first diode to said storage capacitor, said second diode being oriented so as to allow current to flow from said drain through said second diode to said storage capacitor.

2. The switching device of claim 1 further comprising a first resistor connected in series with said first diode between said control terminal and said storage capacitor and a second resistor connected in series with said second diode between said drain and said storage capacitor.

3. The switching device of claim 2 wherein the resistance of said first resistor is greater than the resistance of said second resistor.

4. The switching device of claim 1 wherein said first and second diodes are coupled to a first terminal of said storage capacitor.

5. The switching device of claim 4 wherein a second terminal of said storage capacitor is coupled to said source.

6. The switching device of claim 1 wherein said storage capacitor is selected to be of sufficient size such that more than one-half of a current flowing to a gate of said MOSFET when said MOSFET is turned on originates in said storage capacitor.

7. The switching device of claim 1 wherein said power supply circuitry further comprises a control circuit connected to said storage capacitor.

8. The switching device of claim 7 wherein said control circuit comprises a gate control circuit for biasing a gate of said MOSFET.

9. The switching device of claim 8 wherein said gate control circuit comprises a plurality of buffers.

10. The switching device of claim 1 further comprising a zener diode connected to said storage capacitor, said zener diode being for clamping a voltage across said storage capacitor.

11. The switching device of claim 1 further comprising an additional control terminal connected to said storage capacitor for connecting to an external source of power.

12. A switching device comprising:

a power MOSFET, said MOSFET having a source, a drain and a gate, said drain being coupled to a first main terminal of said device, said source being coupled to a second main terminal of said device; and power supply circuitry for driving said gate, said power supply circuitry comprising a storage capacitor, an output of said power supply circuitry being coupled to said gate, a control terminal of said device being coupled serially through a first diode and a first resistor to said storage capacitor, said drain being coupled serially through a second diode and a second resistor to said storage capacitor, wherein said storage capacitor is charged by a current from said control terminal when said MOSFET is turned on and by a current from said first main terminal when said MOSFET is turned off, and wherein the resistance of said first resistor is greater than the resistance of said second resistor.

13. The switching device of claim 12 wherein said current from said first main terminal is larger than said current from said control terminal.

14. A switching device comprising:

a power MOSFET, said MOSFET having a source, a drain and a gate, said drain being coupled to a first main terminal of said device, said source being coupled to a second main terminal of said device; and power supply circuitry for driving said gate, said power supply circuitry comprising a storage capacitor, an output of said power supply circuitry being coupled to said gate, a control terminal of said device being coupled through a first diode to said storage capacitor, said drain being coupled through a second diode to said storage capacitor, said power supply circuitry further comprising a control circuit connected to said storage capacitor, said control circuit comprising a gate control circuit for biasing said gate, said gate control circuit comprising a plurality of CMOS buffers connected in series.

15. The switching device of claim 14 wherein each of said CMOS buffers contains an NMOSFET, a gate width-to-length ratio of the respective NMOSFETs increasing in successive CMOS buffers in the series.

16. The switching device of claim 14 wherein each of said CMOS buffers contains an PMOSFET, a gate width-to-length ratio of the respective PMOSFETs increasing in successive CMOS buffers in the series.

17. The switching device of claim 14 wherein an input capacitance of a first CMOS buffer in said series in less than a gate capacitance of said power MOSFET.

18. A switching device comprising:

a power MOSFET, said MOSFET having a source, a drain and a gate, said drain being coupled to a first main terminal of said device, said source being coupled to a second main terminal of said device; and power supply circuitry for driving said gate, said power supply circuitry comprising a storage capacitor, an output of said power supply circuitry being coupled to said gate, a control terminal of said device being coupled through a first diode to said storage capacitor, said drain being coupled through a second diode to said storage capacitor, said power supply circuitry further comprising a control circuit connected to said storage capacitor and a charge pump.

19. The switching device of claim 18 wherein said control circuit further comprises a gate control circuit, an output of said charge pump being connected to said gate control circuit.

20. The switching device of claim 19 wherein said gate control circuit comprises a plurality of buffers, said charge pump being connected so as to power said buffers.

21. A switching device comprising:

a power MOSFET, said MOSFET having a source, a drain and a gate, said drain being coupled to a first main terminal of said device, said source being coupled to a second main terminal of said device; and power supply circuitry for driving said gate, said power supply circuitry comprising a storage capacitor, an output of said power supply circuitry being coupled to said gate, a control terminal of said device being coupled through a first diode to said storage capacitor, said drain being coupled through a second diode to said storage capacitor, said switching device further comprising an additional control terminal connected to said storage capacitor for connecting to an external source of power, said additional control terminal being connected to said storage capacitor through a third diode.

22. A switching device comprising:

a power MOSFET, said MOSFET having a source, a drain and a gate, said drain being coupled to a first main terminal of said device, said source being coupled to a second main terminal of said device;

power supply circuitry for driving said gate, said power supply circuitry comprising a storage capacitor, an output of said power supply circuitry being coupled to said gate, a control terminal of said device being coupled serially through a first diode and a second MOSFET to said storage capacitor, said drain being coupled through a second diode to said storage capacitor; and an additional control terminal connected to said storage capacitor for connecting to an external source of power.

23. The switching device of claim 22 wherein a gate terminal of said second MOSFET is connected to said additional control terminal.

24. The switching device of claim 23 wherein said power MOSFET comprises an N-channel MOSFET and said second MOSFET comprises a P-channel MOSFET.

25. The switching device of claim 22 wherein said second MOSFET is for disconnecting said gate of said power MOSFET from said control terminal when said additional control terminal is connected to said external source of power.

26. A method of generating a supply voltage comprising the steps of:

providing a switching device, said switching device comprising a MOSFET, a storage capacitor, a first diode connected between a drain of said MOSFET and said storage capacitor, and a second diode connected between a control terminal of said switching device and said storage capacitor;

repeatedly raising and lowering a voltage at said control terminal so as to turn said MOSFET on and off in succession, whereby a current flows from said drain to said storage capacitor when said MOSFET is turned off and a current flows from said control terminal to said storage capacitor when said MOSFET is turned on, charge thereby being stored in said storage capacitor; and using the charge stored in said storage capacitor to provide said supply voltage.

27. The method of claim 26 comprising the further step of using said supply voltage to drive a gate of said MOSFET.

28. The method of claim 26 comprising the further step of clamping the voltage across said storage capacitor using a zener diode.

29. The method of claim 26 comprising the further step of using said supply voltage to supply a charge pump.

30. The method of claim 26 comprising the further steps of using said supply voltage to supply a buffer and using an output of said buffer to drive a gate of said MOSFET.

* * * * *

UNITED STATES PATENT AND TRADEMARK OFFICE
CERTIFICATE OF CORRECTION

PATENT NO.    : 5,726,594
ISSUE DATE    : March 10, 1998
INVENTOR(S)   : Williams, Richard K.

It is certified that error appears in the above-identified patent and that said Letters Patent is hereby corrected as shown below:

Col. 4, line 15, "said gate and" is added before "a control terminal".

Col. 4, line 65, "said gate and" is added before "a control terminal".

Col. 5, line 54, a comma is added after "capacitor"; "and" is deleted; and "said power supply further comprising" is added before "a charge pump".

Col. 6, lines 43-44, "connected between" is deleted and replaced by "which connects a gate of said MOSFET and".

Col. 6, line 44, "and" is deleted and replaced by "with".

Claims 8, 9, 14, 15, 16 and 17 are deleted.

Signed and Sealed this

First Day of August, 2000

*Attest:*

*Attesting Officer*

Q. TODD DICKINSON

*Director of Patents and Trademarks*